(12) United States Patent
Ernst et al.

(10) Patent No.: US 6,649,450 B2
(45) Date of Patent: Nov. 18, 2003

(54) METHOD OF PRODUCING AN INTEGRATED CIRCUIT AND AN INTEGRATED CIRCUIT

(75) Inventors: Georg Ernst, Thalmassing (DE); Horst Gröninger, Maxhütte (DE); Thomas Zeiler, Regensburg (DE)

(73) Assignee: Infineon Technologies AG, Munich (DE)

( * ) Notice: Subject to any disclaimer, the term of this patent is extended or adjusted under 35 U.S.C. 154(b) by 38 days.

(21) Appl. No.: 10/022,653

(22) Filed: Dec. 18, 2001

(65) Prior Publication Data

US 2002/0079560 A1 Jun. 27, 2002

(30) Foreign Application Priority Data

Dec. 18, 2000 (DE) .......................................... 100 63 041

(51) Int. Cl.[7] ............................................... H01L 21/56
(52) U.S. Cl. ..................................... 438/123; 438/125
(58) Field of Search ................... 438/113, 111, 438/118, 123, 366, 380, 124, 126, 112, 125

(56) References Cited

U.S. PATENT DOCUMENTS 5,879,965 A * 3/1999 Jiang et al. ................. 438/125
5,970,320 A * 10/1999 Yamasaki et al. ........... 438/123

FOREIGN PATENT DOCUMENTS

| JP | 59 208 755 A | 11/1984 |
| JP | 1-57 726 | 3/1989 |
| JP | 03 106 063 A | 5/1991 |
| JP | 04 064 256 A | 2/1992 |
| JP | 04 157 761 A | 5/1992 |
| JP | 05 082 694 A | 4/1993 |
| JP | 06 005 758 A | 1/1994 |
| JP | 06 342 864 A | 12/1994 |
| JP | 07 045 769 A | 2/1995 |
| JP | 11 345 927 A | 12/1999 |

* cited by examiner

Primary Examiner—Wael Fahmy
Assistant Examiner—Hoa B. Trinh
(74) Attorney, Agent, or Firm—Laurence A. Greenberg; Werner H. Stemer; Gregory L. Mayback

(57) ABSTRACT

A circuit is described which has a semiconductor component surrounded by a plastic housing and with which contact can be made via conductor tracks. Between each dividing surface of the conductor tracks and an area of the plastic housing surrounding the relevant dividing surface, as viewed in plan view of the dividing surface, a spacing is provided in each case.

5 Claims, 3 Drawing Sheets

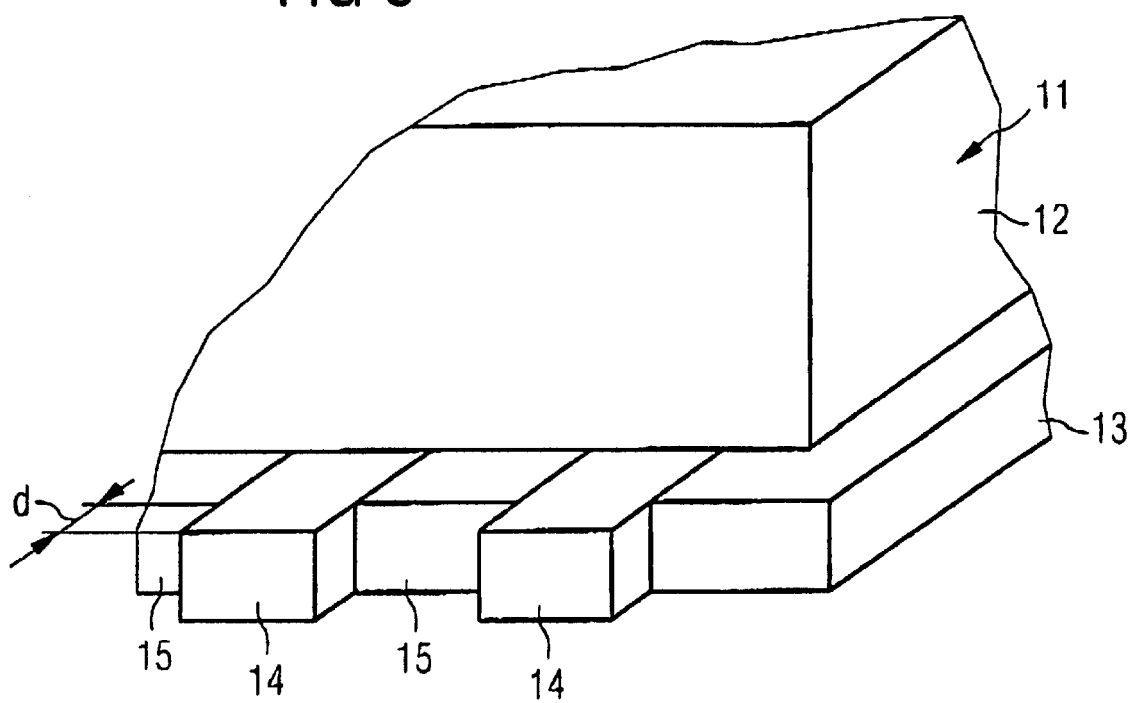

METHOD OF PRODUCING AN INTEGRATED CIRCUIT AND AN INTEGRATED CIRCUIT

BACKGROUND OF THE INVENTION

Field of the Invention

The invention relates to a method of producing an integrated circuit and to an integrated circuit per se.

In the prior art, integrated circuits are known in which a semiconductor component is fitted to a leadframe section. The semiconductor component and the leadframe section are surrounded by a plastic housing. The leadframe section has conductor tracks that pass through an outer surface of the plastic housing. Following the fitting of the plastic housing to the leadframe section and to the semiconductor component, the conductor tracks are severed, so that they terminate substantially flush with an outer surface of the plastic housing.

The step of severing the conductor tracks in the area of the outer surface of the plastic housing is also referred to as "separation". For this purpose, punch tools are used which are constructed in such a way that the conductor tracks can be severed very close to or directly at the outer surface of the plastic housing. In some methods of the prior art, a cut is even deliberately made through areas of the plastic housing, in order to separate the relevant integrated circuits. In the case of the methods disclosed by the prior art, it is disadvantageous that the cutting tools used for this purpose, in the form of a cutting punch and a cutting dye, are subject to extreme wear. In addition, fractures on account of "chipping" and also micro cracks or micro gaps can occur on the plastic housing. As a result of such irregularities, moisture can penetrate into the inside of the plastic housing, which can lead to undesired failures, particular during the operation of leadless housing circuits. In addition, in particular in the case of leadless housing circuits produced by known methods, it is disadvantageous that these often fail during operation, since there may be unreliable solder points on the conductor track section.

SUMMARY OF THE INVENTION

It is accordingly an object of the invention to provide a method of producing an integrated circuit and an integrated circuit which overcome the above-mentioned disadvantages of the prior art methods and devices of this general type. In addition, it is an object of the invention to provide an improved leadless housing circuit.

With the foregoing and other objects in view there is provided, in accordance with the invention, a method of producing an integrated circuit. The method includes providing a leadframe having at least one leadframe section. The leadframe section carries a semiconductor component surrounded by a plastic housing. The leadframe section has conductor tracks passing through an outer surface of the plastic housing. At least one transition area between the plastic housing and the conductor tracks is subjected to high-energy radiation such that parts of the plastic housing are removed in the transition area before performing a step of cutting through the conductor tracks for separating the integrated circuit.

According to the invention, before the step of cutting through the conductor tracks in order to separate the integrated leadless housing circuit, a step is provided of subjecting at least one transition area between the plastic housing and the conductor tracks with high-energy radiation. The step is performed in such a way that, in the transition area between the plastic housing and the conductor tracks, parts of the plastic housing are removed.

As a result of the application of the method according to the invention, a leadless housing circuit is provided which may be employed particularly advantageously. The leadless housing circuit has a semiconductor component which is surrounded by the plastic housing and with which contact can be made via conductor tracks. In this case, the conductor tracks pass through the outer surface of the plastic housing. The conductor tracks each have a dividing surface prepared by a dividing process after the preparation of the plastic housing. Following the preparation of the plastic housing, a predetermined or defined spacing is provided between each dividing surface and an area of the plastic housing surrounding the relevant dividing surface, as viewed in the plan view of the dividing surface. In this case, the designation "defined" is to be understood to mean that the spacing between each dividing surface and an area of the plastic housing surrounding the relevant dividing surface has not been produced randomly, for example as a result of fracture, but by a conscious influence. Such a conscious influence may be recognized, for example, in that in the area of each dividing surface of the integrated circuit, a spacing is provided between the dividing surface and the area of the plastic housing surrounding the relevant dividing surface if the relevant dividing surface is provided for contact to be made later.

The size of the relevant spacing between the dividing surface and the area of the plastic housing surrounding the relevant dividing surface depends on the accuracy with which a cutting tool can be guided in the area of the upper surface of the plastic housing. At present, practical spacings of the order of magnitude of 1 $\mu$m to 5 $\mu$m can be achieved. For specific applications of integrated circuits, it can also be advantageous to provide larger spacings, for example in the order of magnitude of 5 $\mu$m to 250 $\mu$m.

The leadless housing circuit according to the invention ensures low-wear fabrication with few rejects.

According to an idea on which the invention is based, the disadvantages in the methods known from the prior art may be avoided in particular if the leadframe sections provided with the plastic housing are immediately subsequently subjected to high-energy radiation in the transition area between the conductor tracks of the respective leadframe section and the plastic housing. In the process, parts of the plastic housing are removed. In the case of the known methods, the parts removed in the process come into contact with the dividing tools in a subsequent step of cutting through the conductor tracks. This was particularly disadvantageous because the fillers contained in the pressing compound for producing the plastic housing promoted wear on the dividing tools. This is particularly so when, during the preparation of the plastic housing, a pressing compound is kept in the area between two conductor tracks located beside each other. Because of the process, the pressing compound projects beyond the actual outer surface of the plastic housing and, particularly in the case of leadless housing circuits, extends in that area in which the subsequent severing of the conductor tracks is carried out. As a result of the action according to the invention on that transition area between the plastic housing and the conductor tracks, which is located between two conductor tracks lying beside each other, the undesirably projecting parts of the plastic housing are removed, so that they no longer come into contact with the dividing tools during the subsequent separation of the leadframe section. As a result, wear on the tools is reduced.

A further idea on which the invention is based, relates to the finding that the fractures at the housing edges, which occur in the case of the known method, and micro cracks or micro gaps at the housing transitions originate from mechanical stressing of the conductor tracks in conjunction with the severing of the conductor tracks. It has been shown that, as a result of the removal of parts of the plastic housing in the transition area between the conductor track and the plastic housing, the mechanical stresses can be reduced, so that an improvement in the durability of the plastic housing can be achieved in the case of the leadless housing circuit according to the invention.

In a particularly advantageous configuration of the method according to the invention, the cutting punch is specifically guided in each case such that it does not contact the plastic housing when cutting through a conductor track. As a result, wear on the cutting punch is prevented.

In the case of the integrated circuit according to the invention, at each conductor track between the dividing surface and an area of the plastic housing surrounding the relevant dividing surface, as viewed in planned view on the dividing surface, a spacing of at least 1 μm is provided. In further refinements of the leadless housing circuit according to the invention, the spacing is at least 5 μm to 50 μm or 5 μm to 250 μm. In the case of this refinement, the mechanical stresses on the plastic housing during the severing of the conductor tracks can be reduced still further. In particular in the case of leadless housing circuits in which the spacing between the dividing surface and the plastic housing surrounding the relevant dividing surface, as viewed in planned view on the dividing surface, is in the range from about 1 to about 5 μm the result is particularly simple and reliable use in subsequent contact-making processes. It has been shown that, in particular in the case of such leadless housing circuits, particularly few undesired plastic and filler particles occur on the functional areas provided for soldering. This results in particularly reliable soldered joints.

In an advantageous refinement, the spectrum and the intensity of the high-energy radiation for acting on the transition area between the plastic housing and the conductor tracks are selected such that, in the process, only parts of the plastic housing are substantially removed, while the conductor tracks are substantially not removed by the high-energy radiation. As a result, weakening of the conductor tracks is avoided. In addition, material from the conductor track is in this way prevented from evaporating and being deposited in the area of the plastic housing. Short circuits could be produced as a result of such deposited conductor track material.

In a particularly preferred refinement of the invention, the spectrum of the high-energy radiation has a maximum in a region of about 1000 nm. This can be produced, in particular, by a red laser, which typically has a wavelength of 1064 nm.

In the case of a red laser, the advantage results that, given correct setting of the intensity, the metallic conductor tracks of the leadframe section are not attacked.

The method according to the invention results in numerous advantages. In the prior art, the components of the generic type are checked by optical checking devices. This can be carried out, for example, following separation or before packaging. Faulty components, such as fractured components or those affected by particles, are sorted out.

Thought has been given to introducing an additional washing process between a two-stage separation process. During the washing process, the components produced should be freed of loose particles and fragments. In the case of lead length cutting, as it is known, the components are precut, so that they still remain in the leadframe. Only then are they subjected to a washing process or a deflash process. The components are then finally separated during the final separation process. The precut leadframes cannot be tinned by electroplating, so that this process sequence can be carried out only with preplated leadframes, as they are known. This results in high material costs and in poor adhesion of the pressing compound used to produce the plastic housing. In addition, the components are subjected to very high stress during punching.

In order to avoid the disadvantages on which the object is based, complicated and costly fabrication methods, such as BCC or MAP molding with separation of the components by sawing have been proposed. However, the methods entail their own problems, which are likewise avoided by the invention.

The invention is distinguished by the fact that the quality and reliability of the separation process are increased. In particular in the case of punching, such as is often applied for separating integrated leadless housing circuits, the avoidance of abrasion on the cutting knives and the cutting plate of the punching tools is of great importance. In addition, by the invention, the cutting forces exerted on the plastic housing via the bending of the conductor tracks are reduced. At the same time, in particular the service life is increased and the wear on the cutting knives and the cutting plate is reduced to a great extent. In addition, the quality of the housing edge, which is often produced by cutting the metallic leadframe and the housing having the pressing compound, is improved, since the quality of the cutting knives, which, as a result of the invention, are no longer so highly stressed, is maintained over a long time period. Finally, the occurrence of micro cracks and fractures such as chipping at the edges of the plastic housing are also avoided, since these are caused by the cutting forces which are produced and which in turn become greater with decreasing quality of the cutting knives. In addition, as a result of the invention only a few particles are produced, so that the quality of the soldered connections produced is increased.

The invention provides in detail for the removal of the pressing compound in the area of the envisaged cutting line. This is carried out by a cutting laser. In this case, the pressing compound of the plastic housing is preferably removed at the point where severing with the cutting tools is subsequently to be carried out. The stamping punches therefore substantially only cut the metallic connection contacts as they cut the edge of the plastic housing. As a result of the clearance produced in this way, the cutting forces which act on the synthetic resin of the plastic housing are reduced to such an extent that no more micro cracks occur at the transition areas between plastic housing and conductor tracks.

The wavelength of the laser preferably used for this purpose is critical for the quality of the clearance. It is preferable for only the synthetic resin of the plastic housing to be cut and not the metallic conductor tracks of the leadframe. It is precisely red lasers that have the property that they do not impair the metallic leadframe, given correct settings.

The method steps according to the invention are preferably applied immediately after the molding of the plastic housing and before deflashing.

A further advantage of the invention is that following the laser clear-cutting, the component can be subjected to electrical processes for deflashing and tinning. Here, in the case of deflashing, the components are advantageously simultaneously freed of the laser trim and lose particles, so that in following method steps there are no longer any lose particles on the leadless housing component produced. This results in the advantage that inexpensive copper leadframes can be used for production, in which leadframes deflashing and the application of electrical processes can take place before lead length cutting and separation.

The laser used for cutting the plastic housing can be integrated into the transfer molding equipment. The handling equipment needed to implement the invention is then already present. A "stand-alone" equipment with its own leadframe handling system is also conceivable.

With the foregoing and other objects in view there is provided, in accordance with the invention, an integrated circuit. The circuit contains at least one semiconductor component, a plastic housing surrounding the semiconductor component and having an outer surface, and conductor tracks passing through the outer surface of the plastic housing for contacting the semiconductor component. The conductor tracks each have a dividing surface prepared after a preparation of the plastic housing, and between the dividing surface and an area of the plastic housing surrounding the dividing surface of each of the conductor tracks, as viewed in a plan view of the dividing surface, a predetermined spacing is defined.

Other features which are considered as characteristic for the invention are set forth in the appended claims.

Although the invention is illustrated and described herein as embodied in a method of producing an integrated circuit and an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a perspective view of a detail of a further plastic housing following a separation step.

DESCRIPTION OF THE PREFERRED EMBODIMENTS

Figure 1:
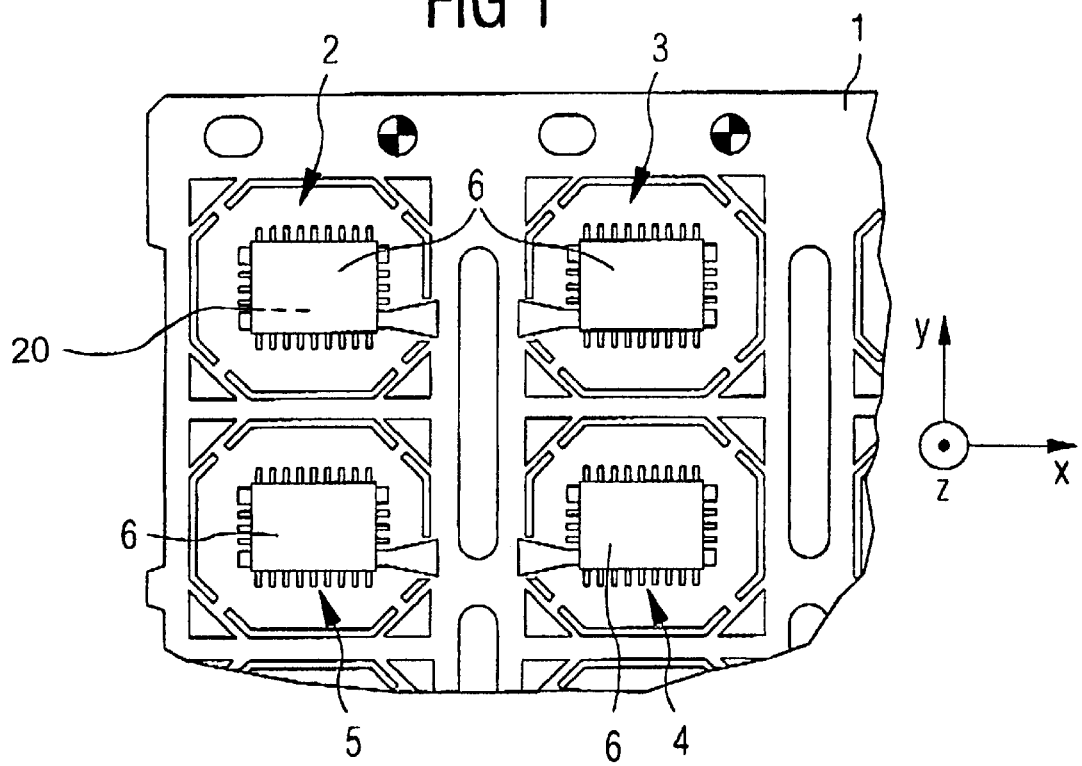
FIG. 1 is a diagrammatic, plan view of a section of a leadframe according to the invention.

Referring now to the figures of the drawing in detail and first, particularly, to FIG. 1 thereof, there is shown a plan view of a section of a leadframe 1, which has a large number of leadframe sections, of which only a first leadframe section 2, a second leadframe section 3, a third leadframe section 4 and a fourth leadframe section 5 can be seen in the plan view. The leadframe sections 2, 3, 4 and 5 are provided with a semiconductor component 20 each and also with a plastic housing 6 covering the semiconductor component 20.

Figure 2:
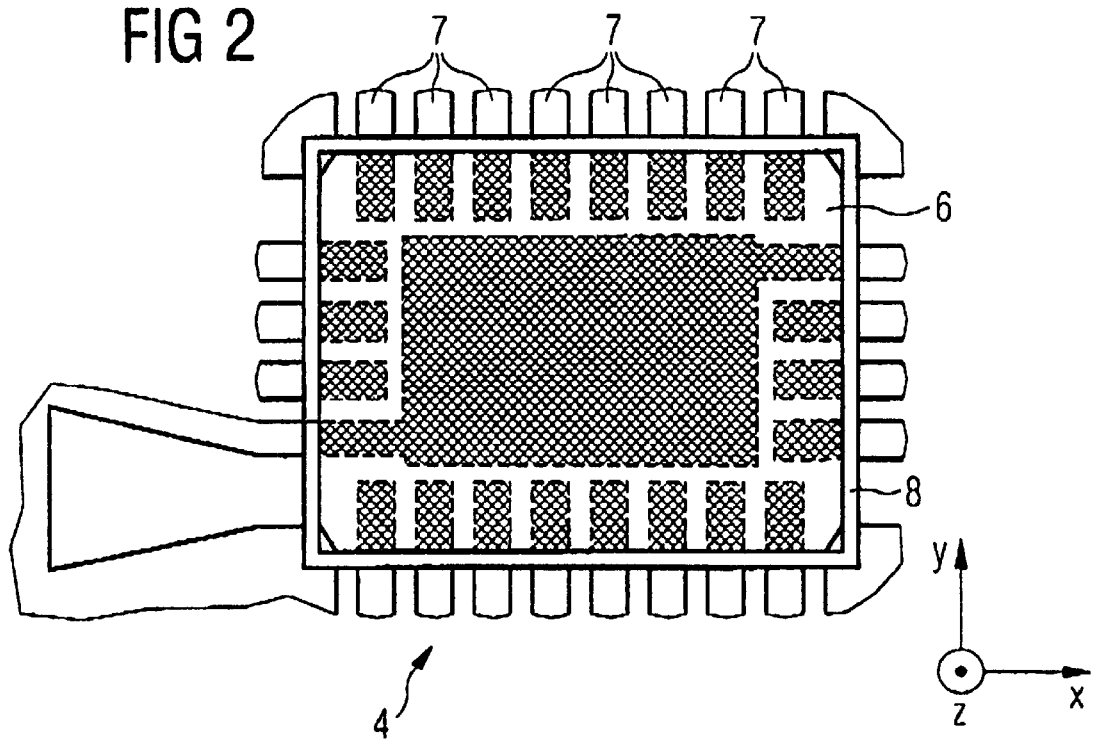
FIG. 2 is a sectional view of a part of the leadframe shown in FIG. 1.

FIG. 2 shows a plan view of an enlarged detail of FIG. 1 in the area of the third leadframe section 4. In the view, it is particularly easy to see that the third leadframe section 4 has a large number of conductor tracks 7, of which, in this view, only the upper row is designated with the reference number 7, for improved clarity. The illustration shown in FIG. 2 is a view from above the third leadframe section 4. Provided on the top is the semiconductor component 20, which is not shown in this view, and is surrounded by the plastic housing 6. In the area off the plastic housing 6, those areas of the conductor tracks 7 which are located in the interior of the plastic housing 6 and which are not visible in the plan view, are provided with cross-hatching. Here, the plastic housing 6 encloses the conductor tracks 7 in such a way that, on the underside of the third leadframe section 4, the conductor tracks 7 still have a visible surface. Otherwise, the conductor tracks 7 are enclosed by the material of the plastic housing 6 in such a way that they are firmly connected to one another.

Also shown in FIG. 2 is a laser track 8. The laser track 8 illustrates the way in which, following the fitting of the plastic housing 6 to the leadframe 1, the contours of the plastic housing 6 are reworked with a red laser of suitable intensity. For this purpose, it is possible to act on the third leadframe section 4 both from below and from above. As a result of the reworking with a laser along the laser track 8, the contour of the plastic housing 6 is reworked, its surface being smoothed. In addition, plastic residues, which originate from the production of the plastic housing 6, are removed in the area of the conductor tracks 7. Such plastic residues can collect in particular in the interspace between two conductor tracks 7 located beside each other.

Figure 3:
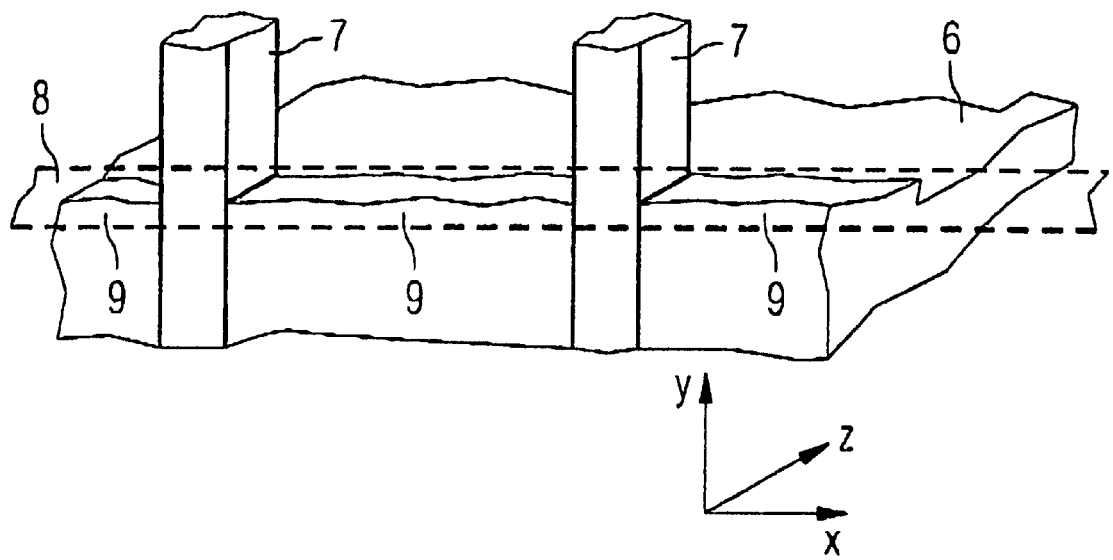
FIG. 3 is a perspective view of a detail of a plastic housing shown in FIG. 2.

FIG. 3 illustrates the mode of action of the laser that operates on the laser track 8 but is not shown in this view. FIG. 3 shows a perspective view of a section of the plastic housing 6 in transition areas between the plastic housing 6 and the conductor tracks 7. As can be seen particularly well in this view, a plastic edge 9 is formed between the conductor tracks 7 during the production of the plastic housing 6. The plastic edge 9 originates from the fact that, during a molding process, a plastic compound is forced into the area between the conductor tracks 7. The plastic compound migrates under the edge of the casting mold for the plastic housing 6 and further along the conductor tracks 7, until the plastic compound hardens.

The laser track 8 runs in such a way that the laser burns away the plastic edge 9, so that, in particular in the area of the conductor tracks 7, a smooth side surface of the plastic housing 6 is produced.

Figure 4:
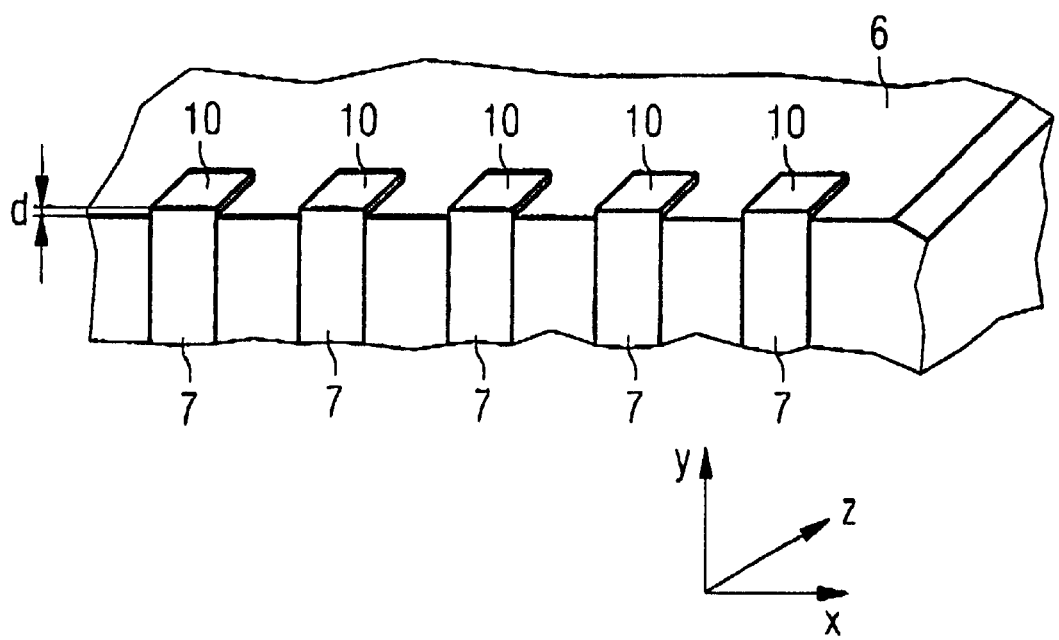
FIG. 4 is a perspective view of a further detail of the plastic housing shown in FIG. 2 following a separation step.

FIG. 4 shows an area of the plastic housing 6 after separation. For this purpose, the conductor tracks 7 have been severed in the vicinity of the side edge of the plastic housing 6. On the conductor tracks 7, this results in dividing surfaces 10, which can be used in following steps to make contact with the conductor tracks 7.

The preceding processing steps with a laser ensure that, in the plan view of the dividing surfaces 10, a spacing d of at least 1 $\mu$m to 5 $\mu$m is provided between the dividing surface 10 and an area of the plastic housing 6 surrounding the dividing surface 10.

FIG. 5 shows a detail of a further plastic housing 11 following a separation step, which has been carried out with the method according to the invention.

The plastic housing 11 is organized into a housing upper part 12, which is disposed on a housing base 13. In this case, the housing base 13 is constructed in such a way that, on the underside of the plastic housing 11, it runs along the outer surface of the housing upper part 12. In this way, a step-like broadening is formed on the underside of the plastic housing 11, within which broadening conductor tracks 14 are disposed. In this view, only two of the conductor tracks 14 are to be seen. Between the conductor tracks 14 there is in each case a plastic edge 15, whose lateral surface has been produced with the aid of a laser. The spacing d between the surface, produced by severing with a cutting tool, in the case of each conductor track 14 and the lateral surface of a plastic edge 15 located beside it in each case is about 1 μm to 5 μm.

In the embodiment according to FIG. 5, a particularly advantageous refinement of the integrated circuit results. As a result of the provision of the housing base 13, which projects beyond the housing upper parts 12, it is specifically ensured that a laser used to implement the laser track has to remove only a little housing material.

We claim:

1. A method of producing an integrated circuit, which comprises the steps of:

provloading a leadframe having at least one leadframe section, the leadframe section carrying a semiconductor component surrounded by a plastic housing, the leadframe section having conductor tracks passing through an outer surface of the plastic housing;

subjecting at least one transition area between the plastic housing and the conductor tracks to high-energy radiation for removing parts at side edges of the plastic housing in the transition area, producing a smooth side surface of the plastic housing extending between the conductor tracks; and cutting the conductor tracks in the vicinity of the side edges of the plastic housing, thereby producing a dividing surface of the conductor tracks and producing a spacing of 1 to 5 μm between the dividing surface and the side surface of the plastic housing surrounding the dividing surface.

2. The method according to claim 1, which comprises selecting a spectrum and an intensity of the high-energy radiation such that when the transition area between the plastic housing and the conductor tracks is subjected to the high-energy radiation, the parts at the side edges of the plastic housing are substantially removed, while the conductor tracks are substantially not removed by the high-energy radiation.

3. The method according to claim 1, which comprises setting a spectrum of the high-energy radiation to have a maximum in a region of about 1000 nm.

4. The method according to claim 3, which comprises producing the high-energy radiation with a red laser.

5. The method according to claim 1, which comprises forming the integrated circuit as a leadless housing circuit.

* * * * *